US012152970B2

(12) United States Patent
Colburn Hildebrand et al.

(10) Patent No.: US 12,152,970 B2
(45) Date of Patent: Nov. 26, 2024

(54) GRIDTAPE FOR FAST NANOSCALE IMAGING

(71) Applicant: President and Fellows of Harvard College, Cambridge, MA (US)

(72) Inventors: David Grant Colburn Hildebrand, Cambridge, MA (US); Brett Jesse Graham, Cambridge, MA (US); Wei-Chung Allen Lee, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 259 days.

(21) Appl. No.: 17/586,727

(22) Filed: Jan. 27, 2022

(65) Prior Publication Data

US 2022/0155190 A1    May 19, 2022

Related U.S. Application Data

(63) Continuation of application No. 16/095,568, filed as application No. PCT/US2017/028164 on Apr. 18, 2017, now Pat. No. 11,280,710.
(Continued)

(51) Int. Cl.
*G01N 1/00*        (2006.01)
*G01N 1/36*        (2006.01)
(Continued)

(52) U.S. Cl.
CPC ......... *G01N 1/36* (2013.01); *G01N 35/00009* (2013.01); *H01J 37/20* (2013.01); *G01N 2001/362* (2013.01)

(58) Field of Classification Search
None
See application file for complete search history.

(56) References Cited

U.S. PATENT DOCUMENTS 7,959,581 B2    6/2011   Calasso
8,366,857 B2    2/2013   Hayworth
(Continued)

FOREIGN PATENT DOCUMENTS

DE          1900808 A1    8/1970

OTHER PUBLICATIONS

Owns, C .S. et al., "Reel-to-Reel Electron Microscopy: Latency-Free Continuous Imaging of Large Sample Volumes"; Microcopy and Microanalysis, vol. 21(S3), pp. 157-158; Aug. 1, 2015 (2 pages).
(Continued)

*Primary Examiner* — Jyoti Nagpaul
(74) *Attorney, Agent, or Firm* — Nixon Peabody LLP

(57) ABSTRACT

A tape for collecting tissue samples in a manner compatible with imaging in a transmission electron microscopy (TEM) system, includes a tape substrate having two side walls forming a trough. The trough is defined by a bottom surface of the tape substrate and internal surfaces of the side walls, with an open side therebetween. A support film is attached to a top surface of the tape substrate, and a plurality of apertures is spaced at predetermined locations along the length of the tape substrate, each aperture being covered by the support film. The tape includes a stacked configuration in which the tape substrate is wound in layers, the bottom surfaces of the side walls in one layer being in contact with the support film in an immediately adjacent layer. The apertures in the second layer are aligned within the trough of the first layer, between the side walls.

14 Claims, 6 Drawing Sheets

Related U.S. Application Data

(60) Provisional application No. 62/325,747, filed on Apr. 21, 2016.

(51) Int. Cl.
  *G01N 35/00* (2006.01)
  *H01J 37/20* (2006.01)

(56) References Cited

U.S. PATENT DOCUMENTS

| | | |
|---|---|---|
| 9,250,253 B2 * | 2/2016 | Markin .............. G01N 33/4833 |
| 9,784,648 B2 * | 10/2017 | Hayworth ................ G01N 1/06 |
| 2003/0170359 A1 | 9/2003 | Garwood |
| 2006/0008790 A1 | 1/2006 | Hayworth |
| 2013/0182318 A1 | 7/2013 | Eastman |

OTHER PUBLICATIONS

Wu, J. H. et al., "Fabrication and characterization of through-substrate interconnects"; IEEE Transactions on Electron Devices; Jun. 2010, vol. 57, No. 6, pp. 1261-1268 (9 pages).

International Search Report in International Application No. PCT/US2017/028164, mailed Jul. 7, 2017 (2 pages).

Written Opinion in International Application No. PCT/US2017/028164, mailed Jul. 7, 2017 (7 pages).

Extended European Search Report in European Patent Application No. EP 21158599.7, mailed Jul. 16, 2021 (8 pages).

* cited by examiner

GRIDTAPE FOR FAST NANOSCALE IMAGING

CROSS-REFERENCE TO RELATED APPLICATIONS

This application is a continuation of U.S. application Ser. No. 16/095,568, filed on Oct. 22, 2018, now allowed, which is a national stage of International Application No. PCT/US2017/028164, filed on Apr. 18, 2017, which claims priority to and benefit of U.S. Provisional Patent Application No. 62/325,747, filed on Apr. 21, 2016, each of which is hereby incorporated by reference herein in its entirety

GOVERNMENT SUPPORT

This invention was made with government support under MH020017, HL007901, NS085320, and MH114047, awarded by the National Institutes of Health (NIH). The government has certain rights in the invention.

FIELD OF THE INVENTION

The present invention relates generally to transmission electron microscopy ("TEM"), and, more particularly, to a TEM-compatible continuous substrate with a protective configuration.

BACKGROUND OF THE INVENTION

TEM offers higher resolution and faster acquisition rates compared with scanning methods. However, these benefits are typically offset by laborious techniques for manually collecting each sample onto a separate imaging substrate, which has been required for maintaining the integrity of a nano-scale electron-transparent substrate on which samples rest. An alternative solution to such laborious manual techniques is covering a tape-based substrate to produce a tape sandwich, such as disclosed in U.S. Pat. No. 8,366,857, titled "Methods, Apparatus And Systems For Production, Collection, Handling, And Imaging Of Tissue Sections." However, this solution is error-prone and inefficient. The present disclosure is directed to solving the above and other needs, including, for example, providing a substrate that allows the use of automated sample collection and handling techniques.

SUMMARY OF THE INVENTION

According to one aspect of the present invention, a tape is directed to collecting tissue samples in a manner compatible with imaging in TEM. The tape includes a tape substrate having two side walls extending from a bottom surface to form a trough, the trough being defined by the bottom surface of the tape substrate and internal surfaces of the side walls. The trough has an open side between bottom surfaces of the side walls. A plurality of apertures is spaced at predetermined locations along the length of the tape substrate, and an electron-lucent support film is attached to a top surface of the tape substrate. Each of the plurality of apertures is covered by the support film for receiving a respective sample. The tape includes a stacked configuration in which the tape substrate is wound in a plurality of layers along its length, the bottom surfaces of the side walls in a first layer of the plurality of layers being in contact with the support film in an immediately adjacent second layer of the plurality of layers. Apertures of the plurality of apertures in the second layer are aligned within the trough of the first layer, between the side walls, for protecting structural integrity of the support film over each respective aperture.

According to another aspect of the present invention, a tape is directed to collecting tissue samples in a manner compatible with imaging in a TEM system, and includes a substrate having a cross-section shape in the form of a channel with a top surface, a bottom surface, and a pair of side walls extending from the bottom surface. The side walls form an internal space with an open side in proximity with bottom surfaces of the side walls. The substrate has a stacked configuration in which the substrate is arranged in several concentric layers along its length, the concentric layers including at least a first layer and an immediately adjacent second layer. A plurality of apertures is centrally positioned across the width of the substrate and equally-spaced along the length of the substrate. Each aperture of the plurality of apertures is covered at least in part by the electron-lucent support film for receiving a respective tissue sample, the support film providing structural integrity for receiving a tissue sample over each aperture. The bottom surfaces of the side walls in the first layer are in contact with the support film or the top surface of the substrate in the second layer, each aperture in the second layer being aligned with the open side between the side walls.

Additional aspects of the invention will be apparent to those of ordinary skill in the art in view of the detailed description of various embodiments, which is made with reference to the drawings, a brief description of which is provided below.

Figure 1:
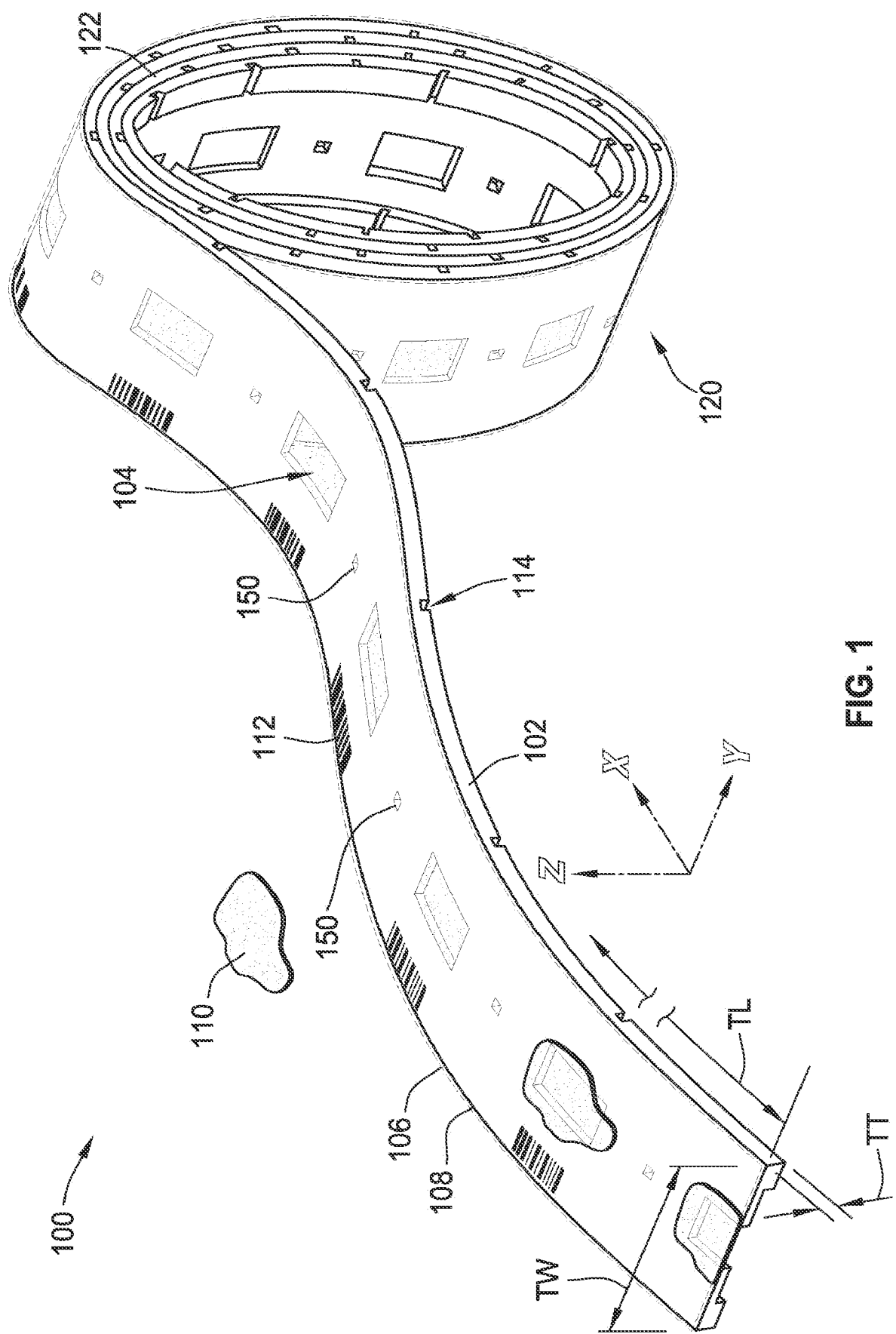
FIG. 1 is an isometric view illustrating a tape for collecting tissue samples in a manner compatible with imaging in a TEM system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

While this invention is susceptible of embodiment in many different forms, there is shown in the drawings and will herein the described in detail preferred embodiments of the invention with the understanding that the present disclosure is to be considered as an exemplification of the principles of the invention and is not intended to limit the broad aspect of the invention to the embodiments illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation."

Referring to FIG. 1, a tape 100 includes a TEM-compatible continuous tape substrate 102 that allows the use of automated sample collection and handling techniques. The tape 100 provides direct benefits, for example, in the collection of large TEM datasets that are common in neuroscience research, which seeks to understand the function of the brain. In other examples, the tape 100 is beneficial in any field that uses TEM, including medical diagnostics. Thus, the tape 100 is compatible with existing automated sample sectioning and collection approaches, but has key features that make it possible, for example, to use a transmission electron microscope instead of scanning electron microscope systems that are currently used for imaging in the neuroscience field.

The tape 100 includes a plurality of apertures 104, which resemble traditional TEM slot grids, and a support film 106 that is attached to a top surface 108 of the tape substrate to cover each aperture 104. Consequently, the support film provides structural support for tissue samples 110 deposited unto the tape 100 for TEM imaging. The tape 100 further includes a plurality of barcodes 112, each barcode 112 being aligned with a respective aperture 104 for identifying or referencing a respective tissue sample 110. The tape 100 also includes a plurality of vents 114, each vent 114 being aligned with a respective aperture for providing an air and moisture removal path when specific vacuum conditions are desired.

The tape 100 is flexible such that it can achieve a stacked configuration 120 in which the tape 100 is rolled unto itself, optionally being spooled unto a supporting reel, resulting in a plurality of concentric layers 122. The tape 100 further has an unstacked configuration 122 in which the tape 100 is unwound in a straight path for observing one or more of the tissue samples 108.

To achieve the stacked and unstacked configuration, the tape 100 includes a flexible material such as a polyimide film or other polymers. By way of example, the material includes an aluminum-coated polyimide film, a platinum-coated polyimide film, a conductive polyimide film, a polyether ether ketone (PEEK) polymer, and a polyethylene terephthalate (PET) polymer. In another more specific example, the material is a KAPTON® polyimide film. One considering factor for selecting the material includes the material's ability to be etched with ultraviolet light. Another factor for selecting the material includes conductivity for being compatible with imaging requirements.

In accordance with one example, the tape 100 has a thickness TT (along a Z axis) of approximately 125 micrometers, a tape width TW (along a Y axis) of approximately 8 millimeters, and a tape length TL (along an X axis) of up to approximately 30 meters. In accordance with other examples, the tape thickness TT is 50 micrometers or larger to provide sufficient structural integrity.

Optionally, the tape 100 further includes a plurality of small inter-slot holes 150 located between apertures 104. According to one example, the holes have a generally square shape of approximately 250 micrometers×250 micrometers. The inter-slot holes 150 provide a beneficial features in which background images of just the support film 106 (on top of the tape 100) are captured. The background images are, then, subtracted from the raw data.

Figure 2:
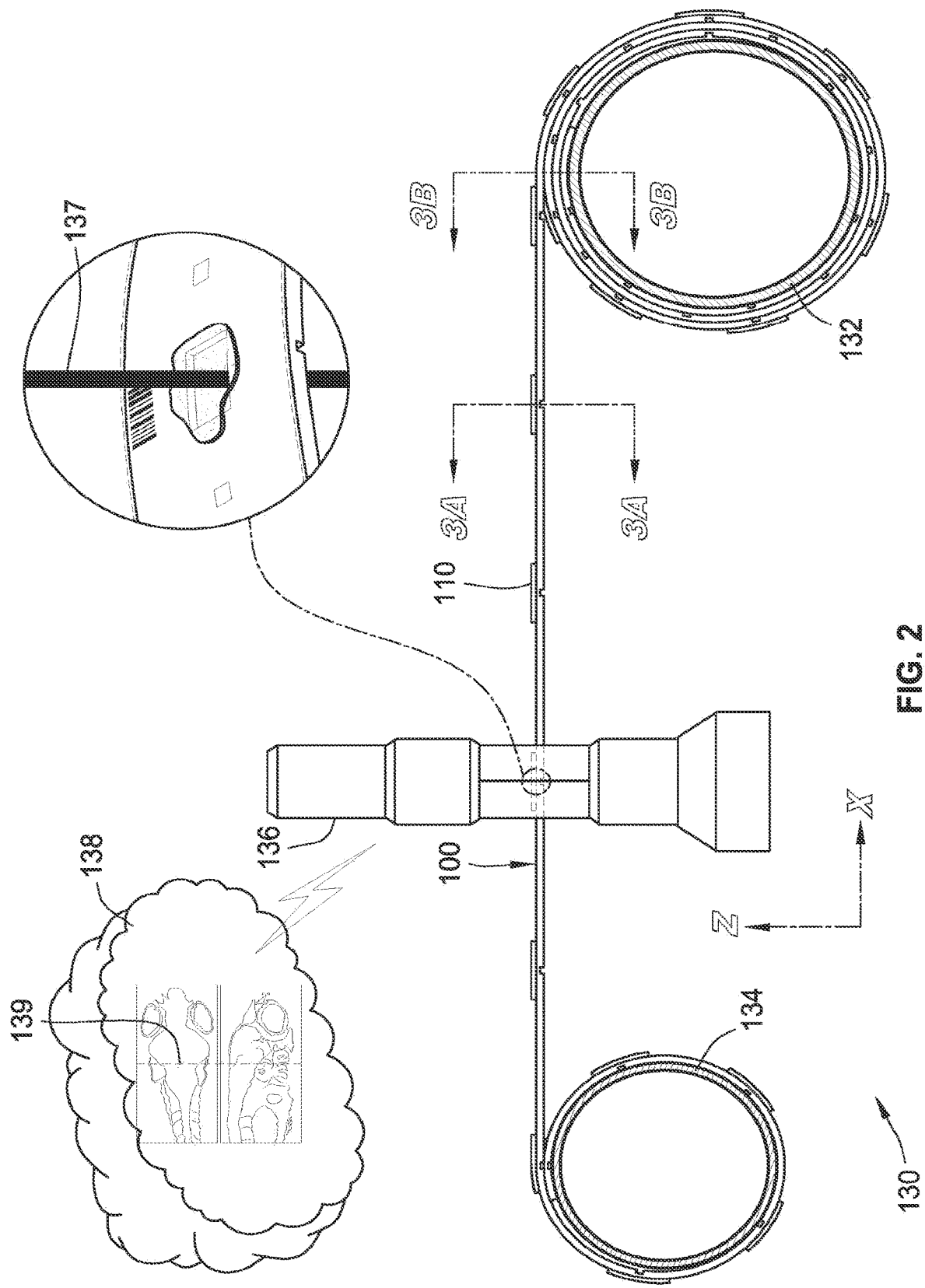
FIG. 2 is a side view illustrating a TEM system in which tissue samples collected onto a tape are imaged via a microscope.

Referring to FIG. 2, a TEM system 130 includes a sending support reel 132 on which the tape 100 is initially stored and a receiving support reel 134 on which the tape 100 is subsequently transferred after tissue samples 108 have been imaged or observed via a transmission electron microscope 136. By way of example, the imaging optionally forms a reconstructed three-dimensional image volume 138 associated with the tissue samples 108, and which includes a representative single section 139 of the three-dimensional image volume 138. More specifically, in the illustrated example, an electron beam 137 is produced by the transmission electron microscope 136 to image physical serial sections 108 that can be virtually reconstructed into the image volume 138 of a larval zebrafish. The serial sections 108 had been previously cut into thousands of thin sections that were, then, collected onto the tape 100.

Figure 3A:
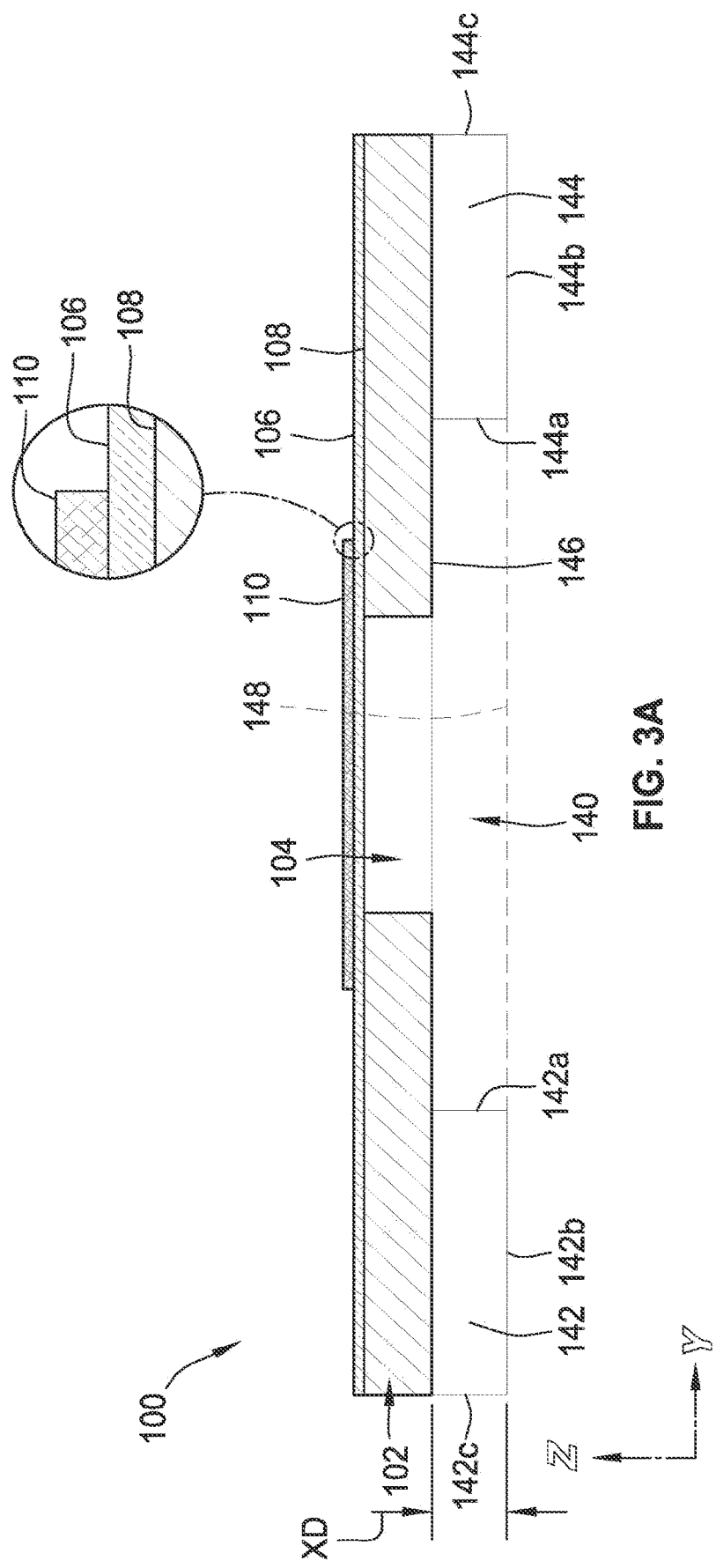
FIG. 3A is a cross-sectional view along lines 3A-3A of FIG. 2 and illustrates the tape in an unstacked configuration.

Referring to FIG. 3A, a cross-sectional view of an unstacked section shows that the tape 100 has a trough 140 formed by two side walls 142, 144 extending from a bottom surface 146 of the tape substrate 102. One benefit of the trough 140 is that it allows the tape 100 to roll onto itself, into the stacked configuration 120, without damaging the tissue samples 108 or the support film 106.

The trough 140 is defined by the bottom surface 146 of the tape substrate and internal surfaces 142a, 144a of the two side walls 142, 144, with an open side 148 extending between bottom surface 142b, 144b of the side walls 142, 144. The side walls 142, 144 have external surfaces 142c, 144c that define outer edges of the tape substrate 102 in a transverse direction (i.e., across its width, along the Y-axis).

In the illustrated example, the trough 140 is generally in the form of a C-shaped channel. However, in other embodiments, the trough 140 has other forms or shapes. By way of a specific example, the trough 140 has a depth XD of approximately 25 micrometers. In other specific examples, the trough depth XD has a range of approximately 6 micrometers to approximately 25 micrometers.

Figure 3B:
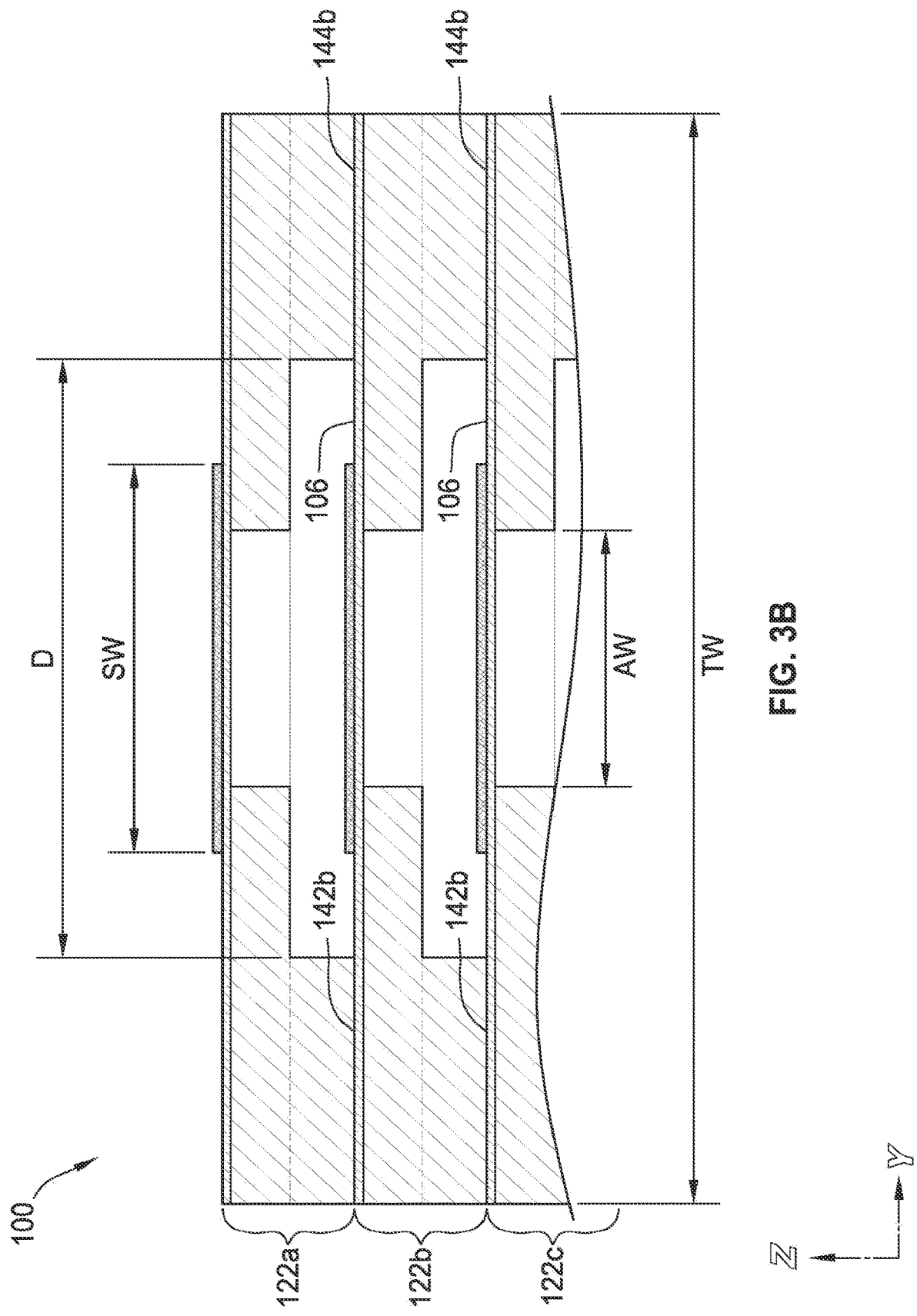
FIG. 3B is a cross-sectional view along lines 3B-3B of FIG. 2 and illustrates the tape in a stacked configuration.

Referring to FIG. 3B, the stacked configuration 120 shows a first layer 122a that is immediately adjacent and in contact with a second layer 122b, which is immediately adjacent and in contact with a third layer 122c. Specifically, bottom surfaces 142b, 144b of the first layer 122a are in contact with the support film 106 of the second layer 122b, and bottom surfaces 142b, 144b of the second layer are in contact with the support film 106 of the third layer 122c. Beneficially, the side walls 142, 144 surround the aperture 104 area to remain clear of the respective support film 106. More specifically, a distance D between the internal surfaces 142a, 144a of the side walls 142, 144 is greater than an aperture width AW or a sample width SW to prevent physical contact with the tissue sample 110. The distance D is less than the tape width TW, in accordance with a wall width between respective external surfaces 142c, 144c and internal surfaces 142a, 144a of the side wall 142, 144. Based on the geometric configuration of the tape 100, the trough 140 creates a natural protective zone in which the structural integrity of a respective tissue sample 110, support film 106, and aperture 104 is maintained without requiring additional, costly films or protective elements.

Figure 4:
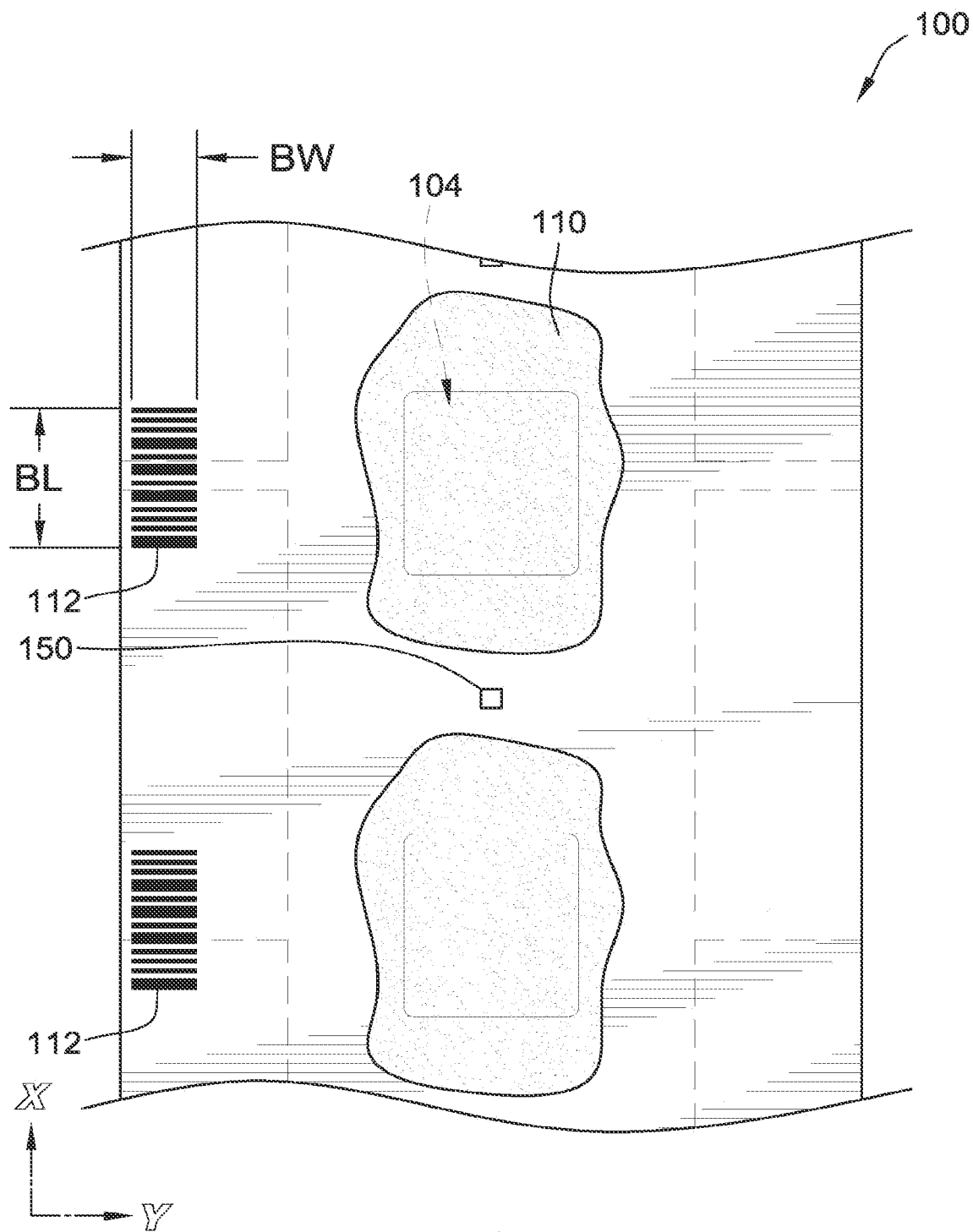
FIG. 4 is a top view illustrating a top surface of the tape of FIG. 1.

Referring to FIG. 4, the barcodes 112 are located in proximity to an edge of the tape 100, have a generally rectangular shape, and are generally centered along the length of the tape 100 (along the X-axis) with respect to an associated aperture 104. According to one example, a barcode 112 has a length BL of approximately 5 millimeters and a width BW of approximately 1 millimeter.

Figure 5:
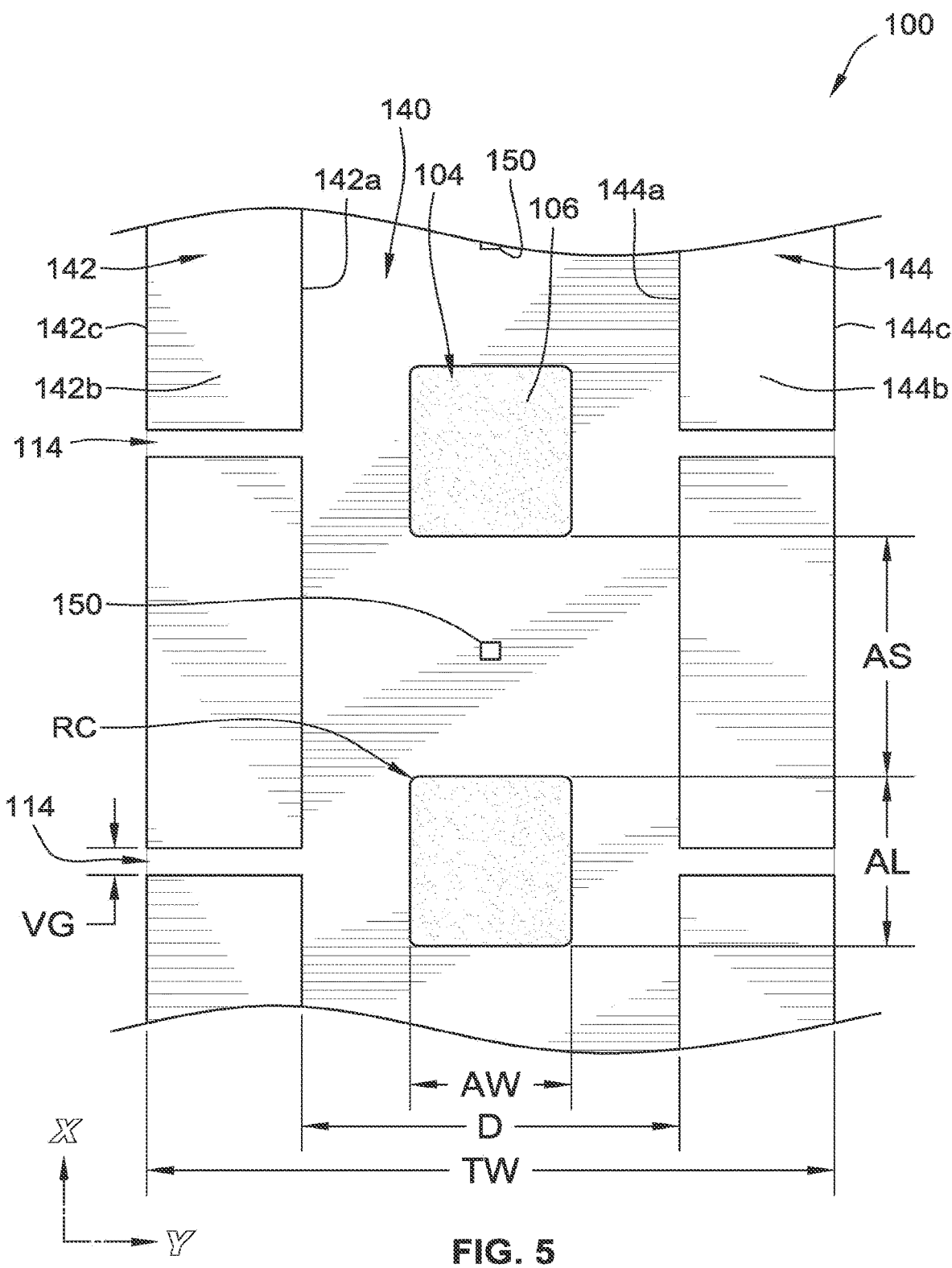
FIG. 5 is a bottom view illustrating a trough of the tape of FIG. 1.

Referring to FIG. 5, the vents 114 are generally centered along the length of the tape 100 (along the X-axis) with respect to an associated aperture 104. According to one example, a vent 114 has a gap VG of approximately 0.1 micrometers (along the X-axis) and extends the full distance of each side wall 142, 144, between respective external surfaces 142c, 144c, and internal surfaces 142a, 144a.

In accordance with a specific example, the apertures 104 have an aperture length AL of approximately 2 millimeters, an aperture width of approximately 1.5 millimeters, and rounded corners RC with a radius of approximately 0.5 millimeters. In accordance with another specific example, the apertures 104 have an aperture length AL of approximately 3 millimeters, an aperture width of approximately 2 millimeters, and rounded corners RC with a radius of approximately 1 millimeter. In accordance with yet another specific example, the apertures 104 are spaced apart at a distance AS that is approximately 4 millimeters.

In accordance with one manufacturing method, the tape 100 is made using a computer numerical control (CNC) ultraviolet (UV) laser system to etch the protective trough 140 and to cleanly cut the apertures 104 (or slots) into a plastic web material. The CNC UV laser approach provides flexibility for addition of other features into and/or through the tape substrate 102, such as the barcodes 112 for section identification, the vents 114 for reducing vacuum pump-down times when imaging tissue samples 110, and/or calibration marks to help configure the tape 100 for handling machines.

The tape 100 provides many benefits over traditional TEM substrates. By way of example, the tape 100 maintains section order, avoids skipping of every other aperture position, and allows for automated sample collection using a commercially available instrument (e.g., ATUMtome, Boeckeler Instruments, Inc.). In another example, the tape 100 is beneficial because it is compatible with reel-to-reel processing and imaging techniques that greatly improve acquisition rates and reduce handling errors. In yet another example, the tape 100 and method of manufacturing is beneficial because the geometry configuration is customizable in accordance with specific needs.

Each of these embodiments and obvious variations thereof is contemplated as falling within the spirit and scope of the claimed invention, which is set forth in the following claims. Moreover, the present concepts expressly include any and all combinations and subcombinations of the preceding elements and aspects.

What is claimed is:

1. A tape for collecting tissue samples, the tape comprising:
    a tape substrate having two side walls extending from a bottom surface to form a trough, the tape substrate being windable in a plurality of layers along its length to form a stacked configuration, the plurality of layers including at least a first layer and a second layer;
    a support film attached to the tape substrate; and
    a plurality of apertures positioned along the length of the tape substrate and covered by the support film, at least one aperture of the plurality of apertures in the second layer being aligned within the trough of the first layer.

2. The tape of claim 1, wherein the trough is defined by the bottom surface of the tape substrate and internal surfaces of the side walls, the trough having an open side between bottom surfaces of the side walls.

3. The tape of claim 1, wherein each aperture of the plurality of apertures is equally spaced from each adjacent aperture of the plurality of apertures.

4. The tape of claim 1, further comprising a plurality of vents in each of the side walls.

5. The tape of claim 1, further comprising a plurality of barcodes along the top surface of the tape substrate.

6. The tape of claim 1, wherein the tape substrate is selected from a group consisting of aluminum-coated polyimide film, platinum-coated polyimide film, polyimide film, conductive polyimide film, polyether ether ketone (PEEK) polymer, and polyethylene terephthalate (PET) polymer.

7. The tape of claim 1, wherein the support film is selected from a group consisting of polyimide film and electron-lucent film.

8. The tape of claim 1, further comprising a plurality of inter-slot holes positioned between adjacent ones of the plurality of apertures.

9. A tape for collecting samples, the tape comprising:
    a substrate having a stacked configuration in which the substrate is arranged in several concentric layers along its length, the concentric layers including at least a first layer and an immediately adjacent second layer, the substrate having a top surface, a bottom surface, and side walls extending from the bottom surface;
    a plurality of apertures spaced along the length of the substrate; and
    a support film attached to the top surface and covering at least in part each aperture of the plurality of apertures, the support film being in contact with the bottom surface of the first layer.

10. The tape of claim 9, further comprising a plurality of vents in each of the side walls.

11. The tape of claim 9, further comprising a plurality of barcodes along the top surface of the substrate.

12. The tape of claim 9, wherein the substrate is selected from a group consisting of aluminum-coated polyimide film, platinum-coated polyimide film, polyimide film, conductive polyimide film, polyether ether ketone (PEEK) polymer, and polyethylene terephthalate (PET) polymer.

13. The tape of claim 9, wherein the support film is selected from a group consisting of polyimide film and electron-lucent film.

14. The tape of claim 9, further comprising a plurality of inter-slot holes positioned between adjacent ones of the plurality of apertures.

* * * * *